US009212952B1

(12) United States Patent
Gopalakrishnan et al.

(10) Patent No.: US 9,212,952 B1
(45) Date of Patent: Dec. 15, 2015

(54) VOLTAGE AND TEMPERATURE SENSOR FOR A SERIALIZER/DESERIALIZER COMMUNICATION APPLICATION

(71) Applicant: Inphi Corporation, Santa Clara, CA (US)

(72) Inventors: Karthik S. Gopalakrishnan, Santa Clara, CA (US); Sadettin Cirit, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 388 days.

(21) Appl. No.: 13/802,219

(22) Filed: Mar. 13, 2013

(51) Int. Cl.
  *G01K 7/00* (2006.01)
(52) U.S. Cl.
  CPC .......................................... *G01K 7/00* (2013.01)
(58) Field of Classification Search
  CPC ........... G01K 7/01; G01K 7/42; G01K 7/015; G01K 7/32; G01K 13/008; G01K 7/00; G01K 7/16
  USPC .................................. 374/142, 163, 170, 171
  See application file for complete search history.

(56) References Cited

U.S. PATENT DOCUMENTS

| | | | | |
|---|---|---|---|---|
| 4,278,841 | A * | 7/1981 | Regennitter et al. | 379/40 |
| 7,168,853 | B2 * | 1/2007 | Ainspan et al. | 702/130 |
| 2004/0174923 | A1 * | 9/2004 | Sengoku et al. | 374/178 |
| 2005/0053118 | A1 * | 3/2005 | Stephan et al. | 374/122 |
| 2007/0120551 | A1 * | 5/2007 | Shin et al. | 324/71.5 |
| 2009/0030644 | A1 * | 1/2009 | Johns et al. | 702/130 |
| 2009/0125267 | A1 * | 5/2009 | Johns et al. | 702/99 |
| 2010/0189160 | A1 * | 7/2010 | Kim et al. | 374/170 |
| 2010/0285571 | A1 * | 11/2010 | Coursey et al. | 374/185 |
| 2011/0080200 | A1 * | 4/2011 | Zhou | 327/172 |
| 2011/0208471 | A1 * | 8/2011 | Lee et al. | 702/124 |
| 2012/0170616 | A1 * | 7/2012 | Tsai et al. | 374/163 |

* cited by examiner

*Primary Examiner* — Lisa Caputo
*Assistant Examiner* — Philip Cotey
(74) *Attorney, Agent, or Firm* — Richard T. Ogawa; Ogawa P.C.

(57) ABSTRACT

The present invention relates generally to integrated circuits. More particularly, the present invention provides a circuit and method for sensing a voltage and/or temperature from an integrated circuit device such as a Serializer/Deserializer (SerDes) integrated circuit device. But it will be recognized that the technique can be used for monitoring other system on chip devices, such as micro-controllers, digital signal processors, microprocessors, networking devices, application specific integrated circuits, and other integrated circuit devices that may desire on-chip temperature and/or voltage sensing capability.

6 Claims, 5 Drawing Sheets

US 9,212,952 B1

VOLTAGE AND TEMPERATURE SENSOR FOR A SERIALIZER/DESERIALIZER COMMUNICATION APPLICATION

BACKGROUND OF THE INVENTION

The present invention relates generally to integrated circuits. More particularly, the present invention provides a circuit and method for sensing a voltage and/or temperature from an integrated circuit device such as a Serializer/Deserializer (SerDes) integrated circuit device. But it will be recognized that the technique can be used for monitoring other system on chip devices, such as micro-controllers, digital signal processors, microprocessors, networking devices, application specific integrated circuits, and other integrated circuit devices that may desire on-chip temperature and/or voltage sensing capability.

Integrated circuits have proliferated through the years. As feature sizes become smaller, certain types of devices have become larger, leading to temperature related problems. That is, a large networking or processing device consumes a large amount of power, which is often dissipated as thermal energy such as heat. Heat is problematic and is desirably controlled and monitored. Unfortunately, conventional devices often lack suitable thermal sensing devices. That is, conventional temperature sensing devices are non-existent in many integrated circuit devices. At best, conventional sensing devices often use a diode device to monitor current information to extract temperature information from other non-integrated integrated circuit devices. The diode device is configured with an analog to digital convert to transmit the temperature information. The converter is often expensive, large, and difficulty to scale and manufacture in an efficient manner. Other limitations include difficulty in calibration, monitoring, and often require multi-point calibration, which leads to additional costs during the manufacture of the integrated circuit.

From the above, it is seen that techniques for improving temperature sensing and monitoring integrated circuits are highly desirable.

BRIEF SUMMARY OF THE INVENTION

The present invention relates generally to integrated circuits. More particularly, the present invention provides a circuit and method for sensing a voltage and/or temperature from an integrated circuit device such as a Serializer/Deserializer (SerDes) integrated circuit device. But it will be recognized that the technique can be used for monitoring other system on chip devices, such as micro-controllers, digital signal processors, microprocessors, networking devices, application specific integrated circuits, and other integrated circuit devices that may desire on-chip temperature and/or voltage sensing capability.

Benefits are achieved over conventional techniques. Among other things, the voltage/temperature sensor devices according to the embodiments of the present invention can be integrated with the underlying devices they measure. Temperature and voltage information at multiple locations of integrated circuits can be quickly and efficiently measured. It is to be appreciated that these sensors are compatible with existing manufacturing processes and thus can be easily adopted. Depending upon the specific embodiment, one or more of these benefits may be achieved. Of course, there can be other variations, modifications, and alternatives.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates generally to integrated circuits. More particularly, the present invention provides a circuit and method for sensing a voltage and/or temperature from an integrated circuit device such as a Serializer/Deserializer (SerDes) integrated circuit device. But it will be recognized that the technique can be used for monitoring other system on chip devices, such as micro-controllers, digital signal processors, microprocessors, networking devices, application specific integrated circuits, and other integrated circuit devices that may desire on-chip temperature and/or voltage sensing capability. Additionally, such techniques can be used for a variety of applications such as network and/or computer storage systems, computer servers, hand held computing devices, portable computing devices, computer systems, network appliances and/or switches, routers, and gateways, and the like.

Figure 1:
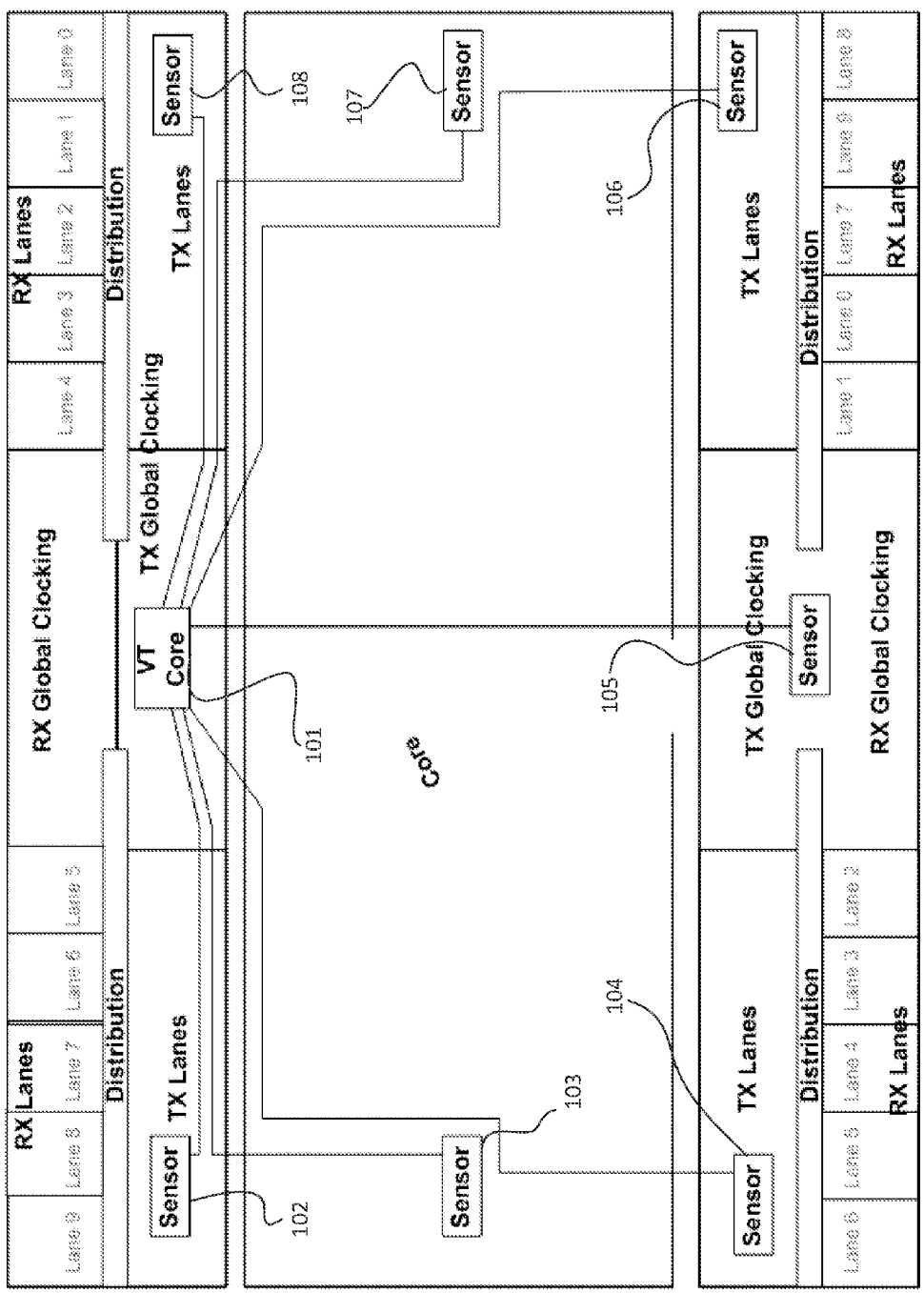
FIG. 1 is a simplified block diagram of a system on a chip integrated circuit device according to an embodiment of the present invention.

An integrated circuits such as SerDes typically have multiple locations that may heat up to a temperature greater than the optimal operating temperature. In various embodiments, the present invention provides sensing techniques for measuring these locations. FIG. 1 is a simplified block diagram of a system on a chip integrated circuit device according to an embodiment of the present invention. This diagram is merely an example, which should not unduly limit the scope of the claims. One of ordinary skill in the art would recognize many variations, alternatives, and modifications. As shown in FIG. 1, an integrated circuits comprises multiple locations that may need temperature and voltage sensing. For example, the integrated circuit in FIG. 1 is a SerDes device that includes a receiver and a transmitter, and it also has receiving lanes (e.g., RX Lanes) and transmission lanes (e.g., TX lanes). Sensors 102 and 108 are positioned within a proximity of TX lanes at the receiver end. Sensors 104 and 106 are positioned within a proximity of TX lanes at the transmission end. Sensors 103 and 107 are positioned at the center portion of the integrated circuit. For example, the sensors detects temperature and/or voltage information and sends the information to the voltage-temperature (VT) core 101 as current levels. The VT core 101, as described below, is configured to process the current information and generates a digital read out of temperature information. In various embodiments, the sensors are capable of measure temperature from about 0 C to over 110 C.

It is to be appreciated that the VT core 101 can be integrated to the integrated circuit. In addition to the SerDes device as shown, the VT core 101 can be integrated with other types of devices, such as SerDes device, a DDR register device, a DSP device, a controller device, a microcontroller device, an ASIC device, or others. For example, an integrated communication device (e.g., SerDes device) is configured on a silicon bearing substrate. The device has a transmitter module and a receiver module, both of which are also configured on the silicon bearing substrate. Additionally, the device comprises a phase lock loop module that is also configured on the silicon bearing substrate. A digital logic core is configured on the same silicon bearing substrate as components of communication device. A voltage and temperature sensing module (e.g., the VT core that connects to the sensors) is configured on the substrate as well. An example of the voltage and temperature sensing module is illustrated in FIG. 2 and described below.

Figure 2:
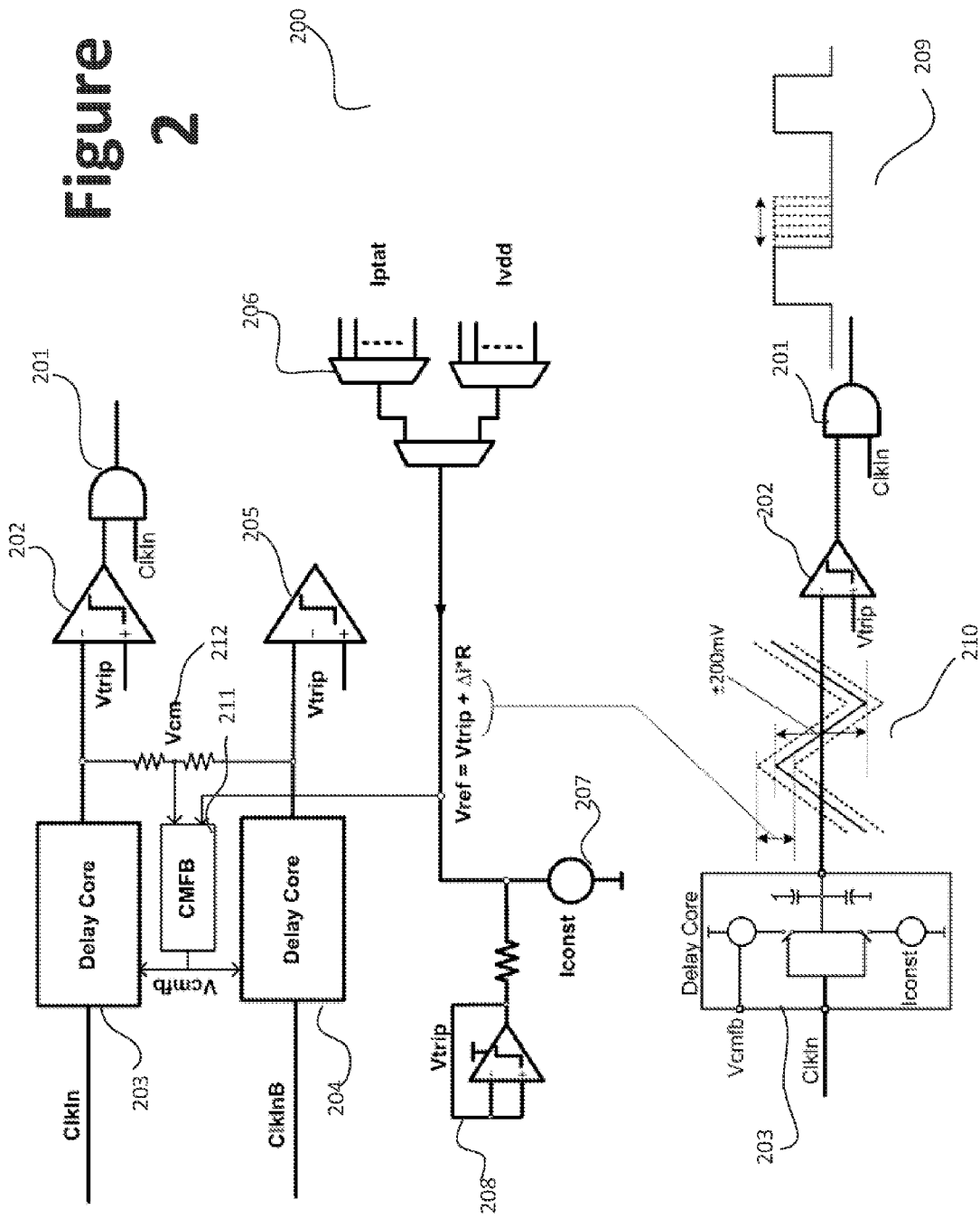
FIG. 2 is a block diagram of a sensing device with a multiplexer according to an embodiment of the present invention.

FIG. 2 is a block diagram of a sensing device with a multiplexer according to an embodiment of the present invention. This diagram is merely an example, which should not unduly limit the scope of the claims. One of ordinary skill in the art would recognize many variations, alternatives, and modifications. The voltage-temperature (VT) core 200 in FIG. 2 can be implemented as an integrated sensing device, and as shown receives a plurality of inputs from sensors (e.g., sensors 102-108 in FIG. 1). In a specific embodiment, analog components of the VT core 200 are on regulated power supply that reduces the possibility of introducing jitters.

In various embodiments, the VT core 200 and the sensors shown in FIG. 1 are manufactured using the same processes (e.g., 40 nm process, 28 nm process, etc.) as the integrated circuit that they measure. The sensor inputs are representative of voltage and/or temperature readings in the form of current levels. The multiplexer 206 is a part of the VT core 200 that allows the VT core 200 to selectively process the VT readings from the sensors one at a time. Depending on the application, the VT core 200 can have a large number of sensors. The selected current information (i.e., representative of temperature and/or voltage) is received by the reference generator 208. For example, the reference generator 208 as shown comprises a comparator and provides an output voltage Vtrip. The reference generator 208 is electrically coupled to the output of the multiplexer 206 and is configured to generate a signal proportional to the current information.

The VT core 200 comprises, among other components, a clock device, which is not shown in FIG. 2. The clock device is configured to generate at least a first clock signal and a second clock signal. The second clock signal is 180 degrees out of phase of the first clock signal. The VT core 200 further comprises delay cores 203 and 204. The first delay core 203 includes a first delay core output, and it is coupled to the clock device to receive the first clock signal. The second delay core 204 has a second delay core output. The second delay core is configured to receive the second clock signal. As shown in FIG. 2, the first delay core 203 is coupled to the second delay core 204 and shares a common feedback voltage (Vcmfb). Delay cores 203 and 204 are both connected to the common feedback signal. Together, the first delay core 203 and the second delay core 204 generate a differential signal that has a common mode representing a temperature reading during the temperature measurement mode, or a voltage reading during the voltage measurement mode. The lower portion of FIG. 2 provides a detailed view of delay core 203. For example, the delay core 204 is similarly configured.

The VT core 200 also includes a common load feedback (CMFB) circuit 211. The CMFB circuit 211 provides the common feedback voltage Vcmfb, which is coupled to the first delay core 203 and the second delay core 204. The CMFB circuit 211 is coupled to a voltage extractor 212. The voltage extractor 212 is also coupled to the outputs of the first delay core 203 and the second delay core 204. For example, the voltage extractor 212 comprises resistors configured in series. Depending on the implementation, the voltage extractor 212 can have different load configurations as well.

A common mode generator circuit 208 is coupled to the common load feedback circuit 211. The common mode generator circuit is configured to operate in a voltage measurement mode or a temperature measurement mode. A load equalizer device 205 is coupled to the second delay core 204 output and the common load voltage extractor 212 as shown.

A comparator device 202 is coupled to the first delay core 203 output and the common load voltage extractor 212. The comparator device 202 is configured to convert a first waveform 210 from the common mode voltage extractor to a second waveform. As shown at the bottom portion of FIG. 2, the first waveform 210 is a triangular waveform. The triangular waveform, as illustrated in FIG. 2, is a function of Vref=Vtrip+i*R. The principle of operation is described in more details below. With the help of the reference generator 208 that provides Vtrip voltage, the triangular waveform is provided from the delay core 203 and contains current information. Reading the triangular waveform and the Vtrip voltage (from the reference generator 208), the comparator 202 is configured to generate a square waveform (not shown in FIG. 2). The square waveform from the comparator 202 and a clock signal are coupled together by the logic gate 201 to generate a pulse width modulated signal 209. The clock signal can be generated by a pulse width generator. In a specific embodiment, the clock signal has a frequency of greater than 2 MHz. For example, the logic gate 201 is an AND gate. The output from the logic gate 201 can be used as a data signal that represents voltage and/or temperature reading of the sensors.

Figure 3:
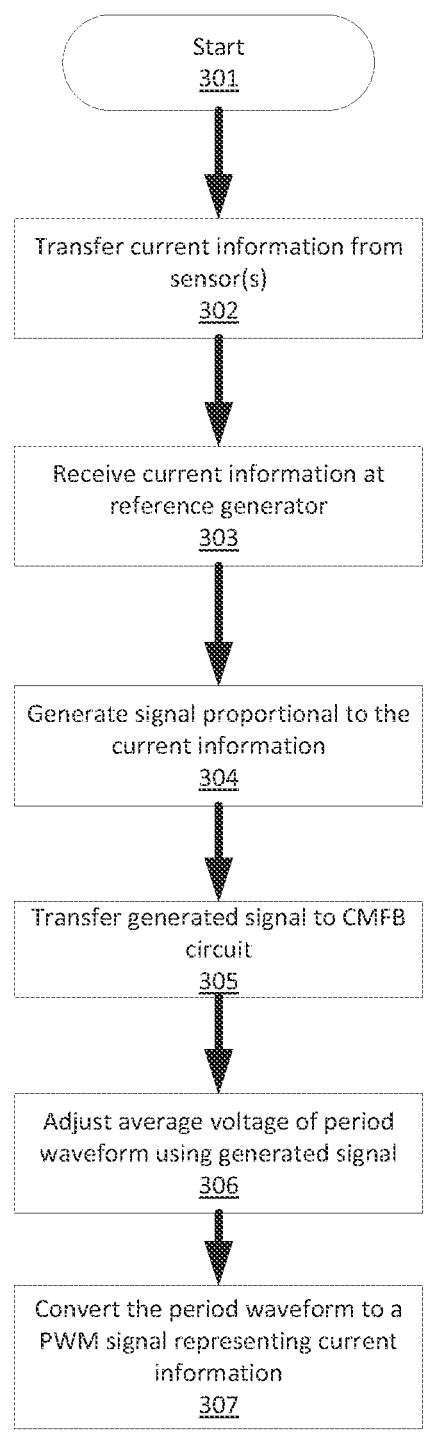
FIG. 3 is a simplified flow diagram illustrating the operation of a sensing device according to embodiments of the present invention.

FIG. 3 is a simplified flow diagram illustrating the operation of a sensing device according to embodiments of the present invention. This diagram is merely an example, which should not unduly limit the scope of the claims. One of ordinary skill in the art would recognize many variations, alternatives, and modifications. For example, the method illustrated in FIG. 3 can be implemented using the exemplary device shown in FIGS. 1 and 2, and various steps may be added, removed, repeated, modified, replaced, and/or overlapped. The method starts at step 301. For example, a temperature and voltage sensing device is started and initiated at step 301. For example, certain variables and/or parameters of the sensing device may be calibrated and/or adjusted at step 301. At step 302, current information from a remote sensing site within the integrated circuit device is transferred to a reference generator. In an embodiment, a multiplexer is used to select different current information from a number of sensing devices. The current information can be from one of many sensors that are connected to a VT core, which includes a reference generator. For example, the reference generator is configured to provide a reference voltage that can be used. As described above, the remote sensing site is provided on a spatial portion of one of a plurality of integrated circuit modules provided on the integrated circuit device. For example, the current information is a variable across an operating range of the integrated circuit device.

At step 303, the current information is received by the reference generator. The reference generator is configured to generate a signal proportional to the current information using the reference generator, at step 304. For example, the signal is a function of a reference voltage, current information from the sensing site, and known resistance (or impedance) value of one or more electrical components of the VT core. At step 305, the generated signal is transferred to a common mode feedback circuit, which is coupled to a first delay core and a second delay core. For example, the connections between the common feedback circuit and the delay cores are illustrated in FIG. 2. At step 306, an average voltage of a period waveform is adjusted using the generated signal at the common mode feedback. For example, the average voltage of the period waveform is a function of the reference voltage and current information received from the sensing site. The periodic waveform is converted to a PWM signal that is representative of the current information at a comparator device, at step 307. For example, the PWM signal can be generated by using the period waveform and a clock signal. The period waveform can be a triangular waveform, a square waveform, or a sinusoidal waveform. The PWM signal, depending on the need, may be transferred to a remote device that is not a part of the integrated circuit.

The PWM signal can be processed and used to provide digital information that represents temperature and/or voltage information embedded in the current information. In a specific embodiment, the pulse width modulated signal is received, and the pulse width modulated signal is used in a counter device to output digital information representative of the current information. As described above, the current information is associated with a temperature or a voltage of the remote sensing site. In an implementation, the pulse width modulated signal is received and processed by a low pass filter device.

In various embodiments, a calibration process is used to provide temperature calibration and measurement. During the calibration mode (which may be necessary as a one-time setup), the current reading from the sensor is calibrated to temperature reading. Running the constant current source at known current level and obtain a current reading from the sensor at a known temperature, the relationship between current reading and the temperature reading is determined. For example, a ratio (e.g., or referred to as "gain") between the current reading and the temperature level is determined and stored for later measurements. When measuring the temperature reading, the ratio is multiplied with a temperature difference from a reference temperature. For example, the following formula is used:

$$\text{Temp} = Tc + \text{Gain} * \{\text{Delay2} - \text{Delay1}\}$$

Voltage calibration and measurement processes are performed similarly as the temperature calibration. A ratio (or "gain") between current reading and the voltage level is determined and stored for later measurements. When measuring the voltage reading, the ratio is multiplied with a voltage difference from a reference voltage. For example, the following formula is used:

$$\text{Voltage} = 1V + \text{Gain} * \{\text{Delay2} - \text{Delay1}\}$$

As an example, the principle of operation for the temperature measurement is illustrated in the formulae below:

$$y(t) = mt + V_{off}(T)$$

$$Y_0 = y(t_x) = mt_x + V_{off}(T)$$

$$t_x(T) = \frac{Y_0 - V_{off}(T)}{m}$$

$$\text{Delay}(T) = t_x(T_c) - t_x(T)$$

where $T_c = 27°$ C.

$$\text{Delay}(T) = \frac{V_{off}(T) - V_{off}(T_c)}{m}$$

where $$m = \frac{I_{cons2}}{C}$$

$$V_{off}(T) = R_{off} * (IPTAT - I_{cons\ 1})$$

$$IPTAT = \frac{kT * \ln(N)}{qR_p} = \frac{kT_c * \ln(N)}{qR_p} + \frac{k(T - T_c) * \ln(N)}{qR_p}$$

$$IPTAT(T_c) = I_{cons\ 1}$$

$$V_{off}(T) = \frac{R_{off} k(T - T_c) * \ln(N)}{qR_p}$$

$$\text{Delay}(T) = \frac{C * R_{off} k(T - 2T_c) * \ln(N)}{qR_p * I_{cons2}}$$

$$\text{TempGain} = \frac{d\text{Delay}(T)}{dT} = \frac{C * R_{off} k * \ln(N)}{qR_p * I_{cons2}} = \frac{C * R_{off} I_{cons1}}{T_c * I_{cons2}}$$

where nominal:
C=11 pF, $R_{off}$=8.8KΩ $I_{cons\ 1}$=40 μA $I_{cons\ 2}$=20 μA $T_c$=300K Therefore TempGain=645 ps/C The principle for the calibration process is illustrated by the formulae below:

Measure I1 at Room Temperature $$I1 = IPTAT(T_c) = \frac{kT_c * \ln(M)}{q * R1}$$

$$I2 = IPTAT(T_c + \Delta T_2) = \frac{k(T_c + \Delta T_2) * \ln(M)}{q * R1}$$

Or change the calibration code "m" times so that $$I2 = IPTAT(T_c + \Delta T_2) = \frac{m(kT_c) * \ln(M)}{q * R1}$$

Measure I2 and Delay2

$$\Delta T_2 = T_c * \left(\frac{I2}{I1} - 1\right)$$

Similarly, $$I3 = IPTAT(T_c + \Delta T_3) = \frac{k(T_c + \Delta T_3) * \ln(M)}{q * R1}$$

Or change the calibration code "n" times so that $$I3 = IPTAT(T_c + \Delta T_3) = \frac{n(kT_c) * \ln(M)}{q * R1}$$

Measure I3 and Delay3

$$\Delta T_3 = T_c * \left(\frac{I3}{I2} - 1\right)$$

$$\Delta T = T_c * \left(\frac{I3 - I2}{I1}\right)$$

ΔDelay=Delay3−Delay2

Therefore, $$\text{TempGain} = \frac{\Delta \text{Delay}}{\Delta T}$$

is calculated from above measurements.

Figure 4:
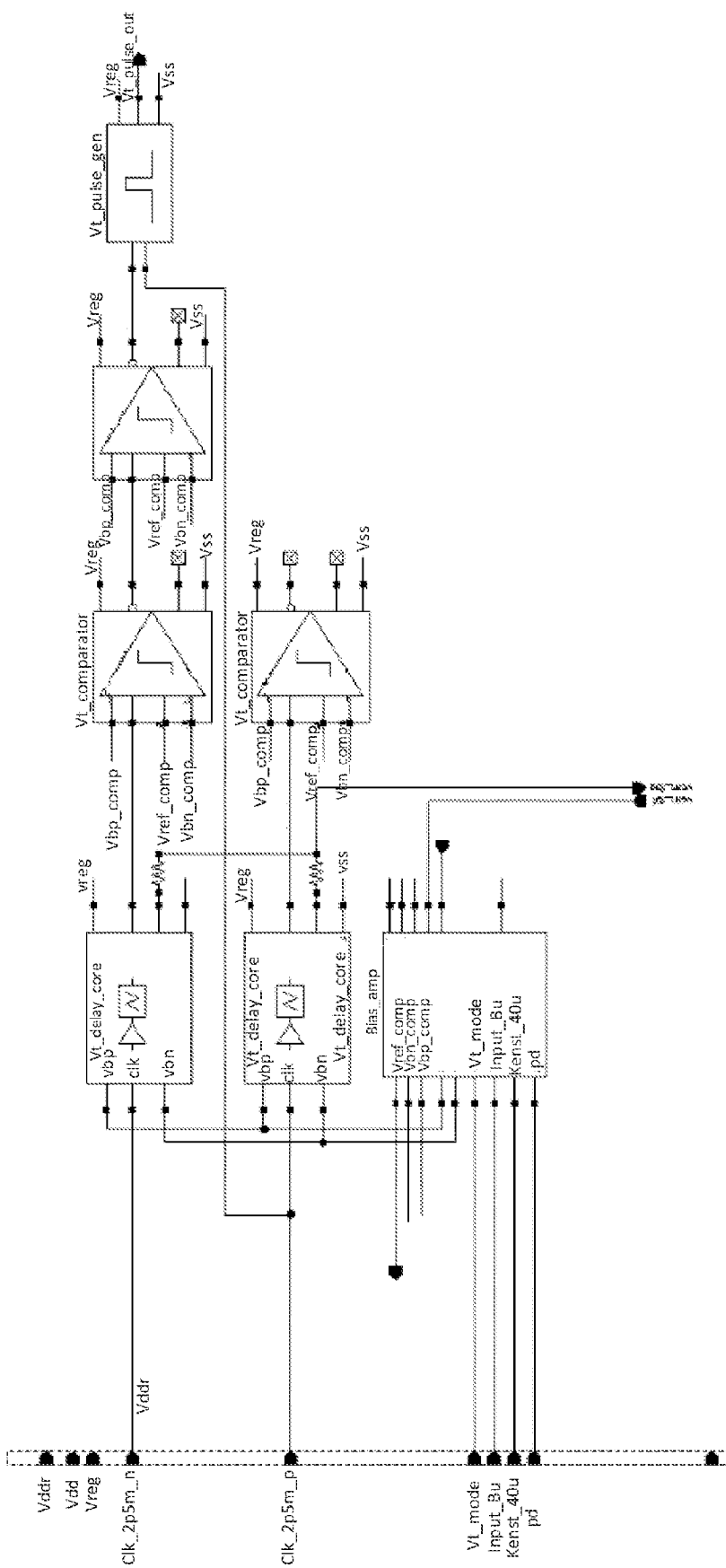
FIG. 4 is a simplified schematic diagram illustrating a VT sensor according to an embodiment of the present invention.
Figure 5:
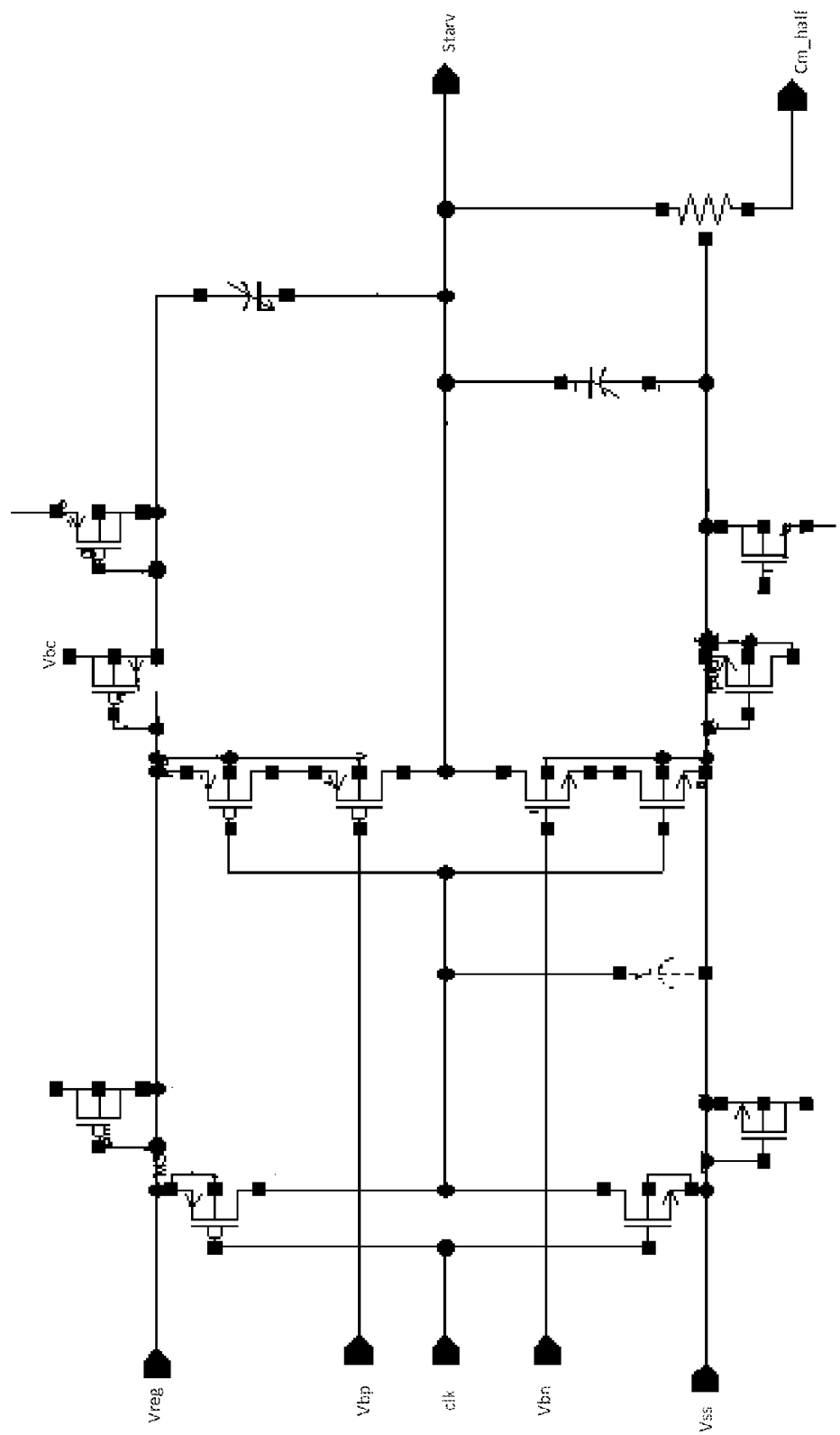
FIG. 5 is a simplified schematic diagram illustrating a delay core according to an embodiment of the present invention.

It is to be appreciated that devices according to embodiments of the present invention can be implemented in various ways. As described above, sensor devices can be manufactured as integrated part of the underlying integrated circuits they measure. FIG. 4 is a simplified schematic diagram illustrating a VT sensor according to an embodiment of the present invention. FIG. 5 is a simplified schematic diagram illustrating a delay core according to an embodiment of the present invention. These diagrams merely provide an example, which should not unduly limit the scope of the claims. One of ordinary skill in the art would recognize many variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An integrated circuit device for temperature and voltage sensing of elements on an integrated circuit system, the device comprising:

a clock device comprising a first clock signal and a second clock signal;

a first delay core comprising a first delay core output, the first delay core being coupled to the first clock signal and receiving input of the first clock signal;

a second delay core comprising a second delay core output, the second delay core being coupled to the second clock signal and receiving input of the second clock signal, and coupled to the first delay core through a first resistor and a second resistor, the second clock signal being 180 degrees out of phase of the first clock signal;

a common load feedback circuit coupled to the first delay core and being coupled to the second delay core through a common mode voltage extractor coupled to the first delay core output and the second delay core output, an input of the common load feedback circuit being coupled to a terminal between the first resistor and the second resistor;

a common mode generator circuit coupled to a common load feedback circuit, the common mode generator circuit being configured to operate in a voltage measurement mode or a temperature measurement mode;

a load equalizer device coupled to the second delay core output and the common load voltage extractor;

a comparator device coupled to the first delay core output and the common load voltage extractor, the comparator device configured to convert a first waveform from the common mode voltage extractor to a second waveform;

a pulse width modulated signal generator coupled to an output of the of the comparator device to output a third waveform; and an input coupled to the common mode generator circuit, the input being coupled to a temperature or voltage source region.

2. The device of claim 1 wherein:
the first waveform is a triangular waveform;
the second waveform is a square waveform; and
the third wave form is a pulse width modulated signal.

3. The device of claim 1 wherein the first delay core comprises a first common mode feedback signal; and the second delay core comprises a second common mode feedback signal; the first delay core and the second delay core generates a differential signal that has a common mode representing a temperature reading during the temperature measurement mode or a voltage reading during the voltage measurement mode.

4. The device of claim 1 wherein the first delay core and the second delay core generates a differential signal that has a common mode representing a temperature reading during the temperature measurement mode or a voltage reading during the voltage measurement mode.

5. The device of claim 1 further comprising a multiplexer device coupled between the input and the temperature or sensing region.

6. The device of claim 1 further comprising a multiplexer device coupled between the input and the temperature or sensing region, the temperature or sensing region being provided on a subsystem on a single integrated circuit device.

* * * * *